(12) United States Patent
Von Malm

(10) Patent No.: US 8,487,329 B2
(45) Date of Patent: Jul. 16, 2013

(54) LIGHT-EMITTING COMPONENT HAVING A WAVELENGTH CONVERTER AND PRODUCTION METHOD

(75) Inventor: Norwin Von Malm, Thumhausen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 256 days.

(21) Appl. No.: 12/680,610

(22) PCT Filed: Sep. 15, 2008

(86) PCT No.: PCT/DE2008/001540
§ 371 (c)(1),
(2), (4) Date: Jul. 19, 2010

(87) PCT Pub. No.: WO2009/039833
PCT Pub. Date: Apr. 2, 2009

(65) Prior Publication Data
US 2010/0295074 A1    Nov. 25, 2010

(30) Foreign Application Priority Data

Sep. 27, 2007 (DE) .......................... 10 2007 046 338
Nov. 7, 2007 (DE) .......................... 10 2007 053 069

(51) Int. Cl.
*H01L 33/00* (2010.01)

(52) U.S. Cl.
USPC .......... 257/98; 438/29; 257/E51.018; 313/504

(58) Field of Classification Search
USPC ................ 257/98, 29; 438/E51.018; 313/504
See application file for complete search history.

(56) References Cited

U.S. PATENT DOCUMENTS

| 2003/0222577 A1 | 12/2003 | Lu |
| 2006/0061260 A1 | 3/2006 | Leo et al. |
| 2007/0024186 A1 | 2/2007 | Chen et al. |
| 2007/0085806 A1 | 4/2007 | Moon |

FOREIGN PATENT DOCUMENTS

| DE | 103 12 679 | 10/2004 |
| EP | 1 191 821 | 3/2002 |
| GB | 2 432 249 | 5/2007 |
| JP | 5-307111 | 11/1993 |
| JP | 2002-184575 | 6/2002 |
| JP | 2004-204289 | 7/2004 |
| JP | 2005-190667 | 7/2005 |
| JP | 2007-109518 | 4/2007 |
| JP | 2007-172948 | 7/2007 |
| JP | 2007-204289 | 8/2007 |
| JP | 2009-512130 | 3/2009 |
| TW | I233312 | 5/2005 |
| TW | 200731859 | 8/2006 |
| WO | WO 01/62868 | 8/2001 |
| WO | WO 02/11209 | 2/2002 |
| WO | WO 2005/005571 | 1/2005 |
| WO | WO 2005/098987 | 10/2005 |
| WO | WO 2007/039849 | 4/2007 |
| WO | WO 2007/055287 | 5/2007 |

OTHER PUBLICATIONS

Duggal, Anil R. et al., "Organic Light-Emitting Devices for Illumination Quality White Light", Applied Physics Letters, vol. 80, No. 19, May 13, 2002, pp. 3470-3472.

*Primary Examiner* — Julio J Maldonado
*Assistant Examiner* — Amar Movva
(74) *Attorney, Agent, or Firm* — Cozen O'Connor

(57) ABSTRACT

A conversion layer (5) is vapor-deposited onto the light-emitting surface. The conversion layer (5) may comprise a vapor-depositable matrix material and a vapor-depositable converter material, which may in particular both comprise low molecular weight organic compounds. A multilayer structure (3), which contains the layers provided for generating radiation, may likewise be built up from low molecular weight organic compounds, such that all the compounds may be applied in the same vapor deposition installation.

6 Claims, 2 Drawing Sheets

LIGHT-EMITTING COMPONENT HAVING A WAVELENGTH CONVERTER AND PRODUCTION METHOD

RELATED APPLICATIONS

This is a U.S. national stage of application No. PCT/DE2008/001540, filed on Sep. 15, 2008.

This application claims the priority of German application no. 10 2007 046 338.5 filed Sep. 27, 2007 and 10 2007 053 069.4 filed Nov. 7, 2007, the entire content of both which is hereby incorporated by reference.

FIELD OF THE INVENTION

The present invention relates to a light-emitting component with a wavelength converter, in particular for a flat light source, and an associated production method.

BACKGROUND OF THE INVENTION

Wavelength converters are used in particular in flat light sources, such as for example in organic light-emitting diodes (OLED). Appl. Phys. Lett. 80, 3470-3472 (2002) describes an electroluminescent component, in which a mixture of organic and inorganic fluorescent converters and a polymeric matrix material is applied onto the back of a substrate. The material particles or molecules, which are provided as converter material, are dispersed or dissolved in a matrix of a liquid polymeric organic material and then applied as a thin layer onto the back of the substrate. With this type of production it is necessary for the matrix material to be suitable for forming a layer or a thin film; a polymeric organic material is therefore used in this case.

SUMMARY OF THE INVENTION

One object of the present invention is to indicate how flat light sources may be provided in a simplified manner with wavelength converters, without complex conventional production processes, such as the use of knife coating, screen printing or adhesive bonding.

According to at least one embodiment of the present invention, provision is made for a matrix material and a converter material to be used in a conversion layer provided for wavelength conversion, the two of which are vaporisable under a high vacuum and may in particular comprise low molecular weight organic compounds.

"Vaporisable under a high vacuum" may mean, for example, that the matrix material and the converter material may be applied by vaporisation under a high vacuum onto a surface provided for radiation emission, without being damaged in the process.

"Low molecular weight organic materials" should be understood, for the purposes of the present invention, to mean the group of organic molecules which are of a non-repetitive structure. These molecules are thus not composed of units which repeat n times, unlike in the case for example of polymers. Furthermore, for the purposes of the present invention, the description "low molecular weight organic materials" also covers materials which belong to the group of oligomers, i.e. molecules of a repetitive structure with $n \leq 10$. In addition, for the purposes of the present invention the description "low molecular weight organic materials" also covers materials which belong to the group of dendrimers, i.e. molecules with outwardly increasing levels of branching.

Aromatic amines, carbazoles or aromatic silane derivatives are particularly suitable as low molecular weight organic matrix material.

Instead of organic matrix materials, inorganic vaporisable systems may also be used, for example at least one of the following materials: $MoO_3$, $ZnS$, $MgF_2$, $Ta_2O_5$, $TiO$, $Al_2O_3$. This means that the matrix material may consist of one of these materials or contain at least one of these materials.

Suitable converter materials which are vaporisable under a high vacuum may be selected from a group which comprises perylenes, benzopyrenes, coumarins, rhodamines and azo, terrylene, quaterrylene, naphthalimide, cyanine, xanthene, oxazine, anthracene, naphthacene, anthraquinone and thiazine dyes. This means that the converter material may consist of at least one of these substances or may contain at least one of these substances.

Such a conversion layer is used in particular for flat emitting, conversion-based electroluminescent components, such as for example organic light-emitting diodes, which may in turn be made in particular from low molecular weight organic compounds. The low molecular weight organic compounds are sublimatable under a high vacuum and may therefore be applied from a high vacuum in the same vapor deposition installation with which the radiation-generating layers of the component are also applied. By using low molecular weight organic compounds for all the layers, which are additionally applied in the same vapor deposition installation, the production process may be substantially simplified.

The invention may be used for light-emitting components, in particular for flat electroluminescent components, which are built up from inorganic or organic materials. Organic light-emitting components, such as for example organic light-emitting diodes, may comprise low molecular weight organic layers for generating light and for charge transport, but also be built up from polymeric organic materials. The number of layers provided for generating radiation and for current injection is not here subject to any limitations. Metals or semiconducting materials, both inorganic and organic, may be used for the electrodes. Preferably, at least one of the electrodes takes the form of a layer transparent with regard to the radiation generated and is provided indirectly or directly with the conversion layer.

For the emission wavelength and for the bandwidth of the spectrum, use of the invention does not introduce any limitations. The converter material functions in the conversion layer as a fluorescent converter and may to this end be present in a different concentration in the matrix material; its absorption band should overlap at least in part with the wavelength range of the emitted radiation. A plurality of converter materials may also be used in the conversion layer. The converter materials may be provided for identical or different emission wavelengths. Production takes place for example by simultaneous vaporisation (co-vaporisation) from a plurality of material sources.

The matrix material may be transparent to any relevant wavelengths; however, it may also consist of a material which absorbs the emitted radiation, whereupon the absorbed radiant energy is supplied via Forster or Dexter transfer to the converter material. A plurality of conversion layers may also be applied in the manner described one over the other or, if shadow masks are used during vapor deposition, next to one another. The colour location of the conversion component may be influenced by the layer thickness of the vapor-deposited conversion layer, the concentration of the emitter molecules in the matrix and the area ratios between conversion layers applied next to one another.

In addition to the light-emitting component, a method is also indicated for producing a light-emitting component with wavelength converter, in which a conversion layer is vapor-deposited onto a surface provided for radiation emission.

A component described herein may preferably be produced with the method. All the features disclosed in relation to the component are therefore also disclosed for the method.

DETAILED DESCRIPTION OF THE DRAWINGS

Figure 1:
FIG. 1 shows an exemplary embodiment of a top emitter LED with electrically conductive substrate in cross-section.
Figure 1:
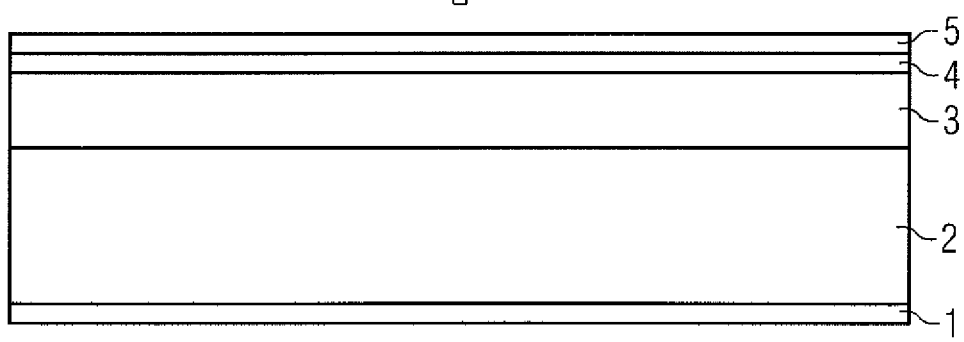

FIG. 1 shows a first exemplary embodiment in schematic cross-section. A first electrode layer 1 provided as back electrode is applied to the back of an electrically conductive substrate 2. On the front of the substrate 2 there is located a multilayer structure 3, which may comprise per se known layers of a light-emitting component, the details of which are not essential to the invention and are therefore not shown. The multilayer structure 3 comprises in particular the active layers provided for generating radiation. Boundary layers or cladding layers provided for current injection may additionally be provided. On the side of the multilayer structure 3 remote from the substrate 2 there is located a second electrode layer 4, which in this exemplary embodiment is applied over the entire surface and consists of a material which is transparent to the radiation to be emitted. Applied to the top of the second electrode layer 4 is the conversion layer 5, which comprises a matrix material and a converter material which are preferably both low molecular weight organic compounds. Radiation is emitted upwards over the entire surface in the direction illustrated by the arrow.

Figure 2:
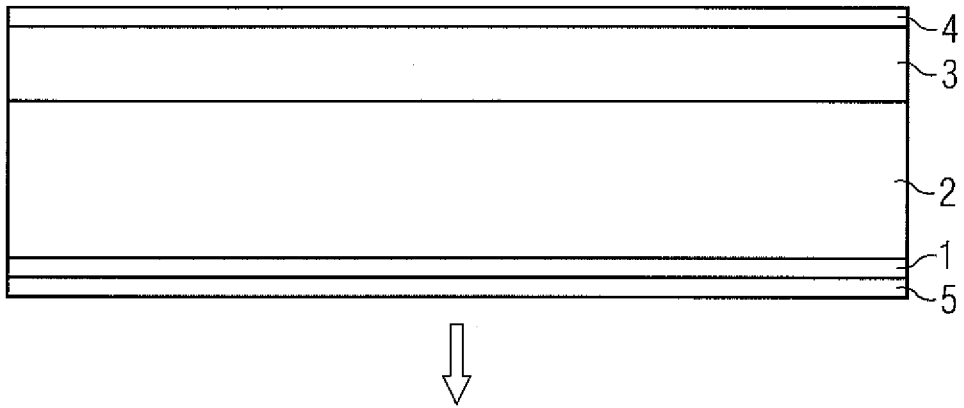
FIG. 2 shows an exemplary embodiment of a bottom emitter LED with electrically conductive substrate in cross-section.
Figure 2:

FIG. 2 shows a schematic cross-section corresponding to FIG. 1 of a further exemplary embodiment, in which the conversion layer 5 is applied to the bottom or back of the component, i.e. to the rear surface of the first electrode layer 1. In this case, the substrate 2 and the first electrode layer 1 are formed from a material transparent to the radiation to be emitted, and light emission proceeds in the direction indicated by the arrow.

The electrode layer, which is provided on the side provided for emission, may however also be opaque for example and surround the emission face in the manner of a ring or frame. In such an embodiment the conversion layer may be applied to the light outlet face within the electrode layer, to a surface of a multilayer structure or directly to the substrate material.

A particular advantage of the invention is obtained in embodiments in which the light-emitting component is a low molecular weight organic light-emitting diode, such that both the electroluminescent layers of the light-emitting diode and the components of the conversion layer may be vapor-deposited in the same installation.

Figure 3:
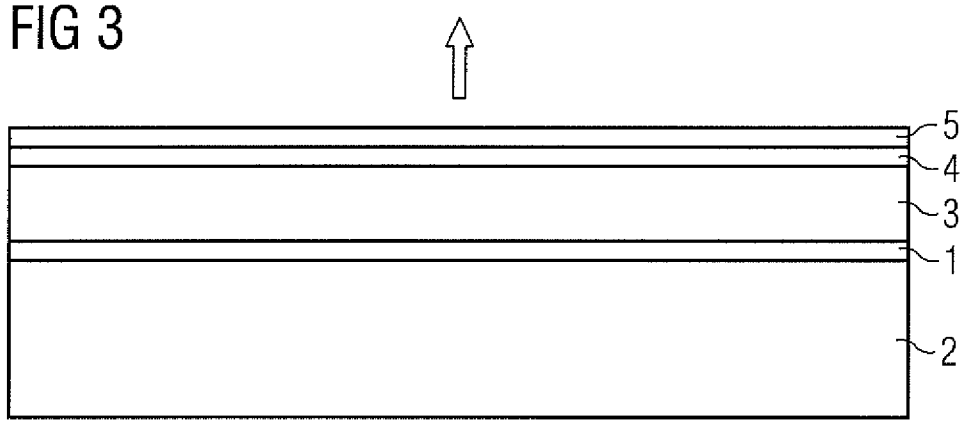
FIG. 3 shows an exemplary embodiment of a top emitter OLED without back electrode in cross-section.

In the case of a top emitter OLED according to FIG. 3 with thin film encapsulation, the conversion layer 5 may be produced immediately after application of the transparent top electrode, the second electrode layer 4. No additional processes for coating with the converter material (for example knife coating, screen printing, adhesive bonding) are therefore any longer required. In this exemplary embodiment, the first electrode layer 1 is arranged on the front of the substrate 2 between the substrate 2 and the multilayer structure 3.

Figure 4:
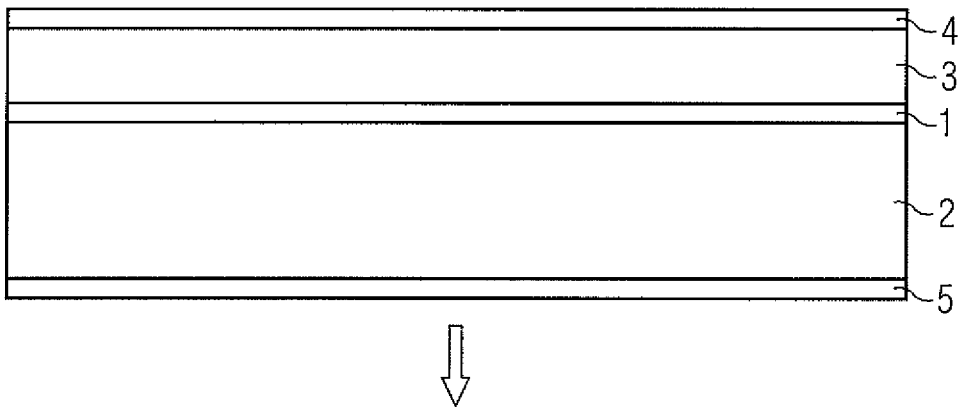
FIG. 4 shows an exemplary embodiment of a bottom emitter OLED without back electrode in cross-section.

In the case of a bottom emitter OLED according to FIG. 4 the conversion layer 5 may even be deposited onto the back of the substrate 2 simultaneously with production of the organic multilayer structure 3. No additional processes for coating with the converter material (for example knife coating, screen printing, adhesive bonding) are therefore any longer required in this exemplary embodiment either.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A light-emitting component with wavelength converter, comprising:
  a light-emitting surface with a conversion layer, which contains a matrix material and a converter material, wherein both the matrix material and the converter material are materials vaporisable under a high vacuum;
  wherein the matrix material and the converter material are selected such that they may be vapor-deposited together with radiation-generating layers;
  wherein the matrix material is selected from the group comprising the following substances: $MoO_3$, $ZnS$, $MgF_2$, $Ta_7O_5$, $TiO$, and $Al_2O_3$; and
  wherein the converter material is selected from a group that comprises perylenes, benzopyrenes, coumarins, rhodamines and azo, terrylene, quaterrylene, naphthalimide, cyanine, xanthene, oxazine, anthracene, naphthacene, anthraquinone and thiazin dyes.

2. The light-emitting component according to claim 1, which forms an organic light-emitting diode.

3. A method of producing the light-emitting component of claim 1 with wavelength converter, comprising vapor depositing a conversion layer onto a surface provided for radiation emission.

4. A method according to claim 3, wherein vapor deposition proceeds in the same installation with which radiation-generating layers of the component are also vapor-deposited.

5. A method according to claim 3, wherein the conversion layer is applied onto an electrode layer of a material transparent to emitted radiation.

6. A method according to claim 3, wherein an organic light-emitting diode is produced.

* * * * *